United States Patent
Ootani

(10) Patent No.: US 8,050,034 B2
(45) Date of Patent: Nov. 1, 2011

(54) ELECTRONIC APPARATUS AND COOLING SYSTEM

(75) Inventor: Yoshiharu Ootani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/687,156

(22) Filed: Jan. 14, 2010

(65) Prior Publication Data

US 2010/0226092 A1    Sep. 9, 2010

(30) Foreign Application Priority Data

Mar. 3, 2009   (JP) ................................. 2009-049371

(51) Int. Cl.
    *H05K 7/20* (2006.01)
(52) U.S. Cl. ................... 361/696; 361/698; 361/679.48; 361/679.49; 361/679.53; 361/699; 361/700; 361/701; 165/80.4; 165/80.5; 165/104.19; 165/104.33; 62/259.2; 454/184
(58) Field of Classification Search ........ 361/679.46–679.54, 688, 689, 361/698, 699, 717–724, 752, 756, 758; 165/80.4, 165/80.5, 121–126, 104.21, 104.33, 104.34, 165/185; 454/184, 187, 233, 236; 62/3, 62/118, 119, 132, 171, 259.1, 259.2, 440, 62/441, 267, 199, 228.4, 203, 186
See application file for complete search history.

(56) References Cited

U.S. PATENT DOCUMENTS

| | | | |
|---|---|---|---|
| 5,052,472 A * | 10/1991 | Takahashi et al. ............ 165/299 |
| 5,058,389 A * | 10/1991 | Yasuda et al. ...................... 62/99 |
| 5,142,877 A * | 9/1992 | Shimizu ........................... 62/129 |
| 5,150,277 A * | 9/1992 | Bainbridge et al. ........... 361/695 |
| 5,414,591 A * | 5/1995 | Kimura et al. ................. 361/695 |
| 5,765,391 A * | 6/1998 | Lee et al. ......................... 62/442 |
| 6,024,165 A * | 2/2000 | Melane et al. ............ 165/104.33 |
| 6,026,891 A * | 2/2000 | Fujiyoshi et al. ......... 165/104.33 |
| 6,467,295 B2 * | 10/2002 | Oh et al. ....................... 62/259.2 |
| 6,490,877 B2 * | 12/2002 | Bash et al. ....................... 62/200 |
| 6,628,520 B2 * | 9/2003 | Patel et al. ..................... 361/696 |

(Continued)

FOREIGN PATENT DOCUMENTS

JP   53-060723 U   5/1978

(Continued)

OTHER PUBLICATIONS

Office Action from Japanese Patent Office in corresponding application 2009-049371, mailed Feb. 1, 2011.

*Primary Examiner* — Michail V Datskovskiy
(74) *Attorney, Agent, or Firm* — Finnegan, Henderson, Farabow, Garrett & Dunner, L.L.P.

(57) ABSTRACT

An electronic apparatus comprises a case configured to house an electronic circuit unit and includes an air intake, through which external air is taken into the case, and an exhausting opening, from which the air is ejected, an circulator provided in the case and configured to take the external air into the case through the air intake and supply the air to the electronic circuit unit, an evaporation unit provided in the case and configured to cool the air by thermal exchange between the air and a working medium and guide the air to the exhausting opening, the working medium being vaporized as a result of the thermal exchange, and a condenser provided out of the case and configured to liquidize the working medium and supply the working medium to the evaporation unit.

8 Claims, 3 Drawing Sheets

U.S. PATENT DOCUMENTS

| | | | |
|---|---|---|---|
| 6,651,452 B2 * | 11/2003 | Lecke et al. | 62/230 |
| 6,658,867 B1 * | 12/2003 | Taras et al. | 62/117 |
| 6,682,895 B2 * | 1/2004 | Mirkin et al. | 506/16 |
| 6,704,198 B2 * | 3/2004 | Replogle et al. | 361/690 |
| 6,819,563 B1 * | 11/2004 | Chu et al. | 361/696 |
| 6,860,116 B2 * | 3/2005 | Lifson et al. | 62/498 |
| 6,925,829 B2 * | 8/2005 | Wei | 62/259.2 |
| 6,970,355 B2 * | 11/2005 | Ellsworth et al. | 361/694 |
| 6,997,006 B2 * | 2/2006 | Kameyama et al. | 62/259.2 |
| 7,051,802 B2 * | 5/2006 | Baer | 165/299 |
| 7,088,585 B2 * | 8/2006 | Chu et al. | 361/699 |
| 7,315,448 B1 * | 1/2008 | Bash et al. | 361/701 |
| 7,385,810 B2 * | 6/2008 | Chu et al. | 361/679.48 |
| 7,619,887 B2 * | 11/2009 | Koch et al. | 361/696 |
| 7,660,117 B2 * | 2/2010 | Werner et al. | 361/696 |
| 7,746,634 B2 * | 6/2010 | Hom et al. | 361/679.53 |
| 7,765,831 B2 * | 8/2010 | Rodriguez et al. | 62/510 |
| 7,768,780 B2 * | 8/2010 | Coglitore et al. | 361/695 |
| 7,808,783 B2 * | 10/2010 | Goth et al. | 361/700 |
| 7,830,658 B2 * | 11/2010 | Van Andel | 361/679.53 |
| 7,855,890 B2 * | 12/2010 | Kashirajima et al. | 361/700 |
| 7,864,527 B1 * | 1/2011 | Whitted | 361/696 |
| 2004/0100770 A1 * | 5/2004 | Chu et al. | 361/698 |
| 2005/0115257 A1 * | 6/2005 | Goth et al. | 62/186 |
| 2005/0207116 A1 * | 9/2005 | Yatskov et al. | 361/690 |
| 2006/0102322 A1 * | 5/2006 | Madara et al. | 165/104.21 |
| 2006/0213219 A1 * | 9/2006 | Beving et al. | 62/468 |
| 2006/0272342 A1 * | 12/2006 | Bash et al. | 62/228.4 |
| 2008/0205003 A1 * | 8/2008 | Belady | 361/700 |
| 2008/0232064 A1 * | 9/2008 | Sato et al. | 361/687 |
| 2009/0080173 A1 * | 3/2009 | Porter et al. | 361/831 |
| 2009/0097205 A1 * | 4/2009 | Matsushima et al. | 361/700 |
| 2009/0100848 A1 * | 4/2009 | Kuriyama et al. | 62/132 |
| 2010/0107658 A1 * | 5/2010 | Cockrell | 62/62 |

FOREIGN PATENT DOCUMENTS

| | | |
|---|---|---|
| JP | 2000-105087 | 4/2000 |
| JP | 2001-358488 | 12/2001 |
| JP | 2002-156136 | 5/2002 |
| JP | 2007-243728 | 9/2007 |

* cited by examiner

ELECTRONIC APPARATUS AND COOLING SYSTEM

CROSS-REFERENCE TO RELATED APPLICATIONS

This application is based upon and claims the benefit of priority from prior Japanese Patent Application No. 2009-049371, filed Mar. 3, 2009, the entire contents of which are incorporated herein by reference.

BACKGROUND OF THE INVENTION

1. Field of the Invention

The present invention relates to an electronic apparatus, and more particularly to a cooling system for the electronic apparatus.

2. Description of the Related Art

An electronic apparatus such as a television transmitter provided in a base station includes heat generating electronic circuits such as a power amplifier. The electronic circuits may be attached to or removed from a case of the electronic apparatus. When a large amount of heat is generated by driving of the circuits, performance characteristics of the electronic apparatus are decreased. Thus, various cooling mechanisms to cool the electronic circuits maintaining desired performance characteristics have been introduced.

For example, Jpn. Pat. Appln. KOKAI Publication No. 2007-243728 discloses a cooling mechanism provided with an exhaust fan to assure cooling reliability. According to the cooling mechanism, the external air is taken in the case of the electronic apparatus, circulated therein, and discharged from the case by the exhaust fan. The electronic circuits are controlled so that the heat generated by the electronic circuits is forced to be expelled from the case. Such forced cooling method is employed to achieve the desired performance characteristics.

However, higher-power outputs from recent electronic circuits generate a larger amount of heat to increase an exhaust heat temperature and a temperature of a room, in which the electronic apparatus is placed. Thus, thermal control for the electronic circuits can be difficult without improving air conditioning performance for the room to decrease the temperature of the air taken into the case.

In view of power-saving, which is strongly required in these days, it is considered to be important addressing a rise in air conditioning performance.

BRIEF SUMMARY OF THE INVENTION

According to an embodiment of the present invention, an electronic apparatus comprises:

a case configured to house an electronic circuit unit and comprising an air intake, through which external air is taken into the case, and an exhausting opening, from which the air is ejected;

an circulator provided in the case and configured to take the external air into the case through the air intake and supply the air to the electronic circuit unit;

an evaporation unit provided in the case and configured to cool the air by thermal exchange between the air and a working medium and guide the air to the exhausting opening, the working medium being vaporized as a result of the thermal exchange; and a condenser provided out of the case and configured to liquidize the working medium and supply the working medium to the evaporation unit.

According to another embodiment of the present invention, a cooling system for an electronic apparatus comprising an electronic circuit unit, the cooling system comprises:

an circulator configured to take external air into a case of the electronic apparatus and supply the air to the electronic circuit unit;

an evaporation unit configured to cool the air by thermal exchange between the air and a working medium and guide the air to be ejected from the case of the electronic apparatus, the working medium being vaporized as a result of the thermal exchange; and a condenser provided out of the case and configured to liquidize the working medium and supply the working medium to the evaporation unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the present invention and, together with the general description given above and the detailed description of the embodiments given below, serve to explain the principles of the present invention.

DETAILED DESCRIPTION OF THE INVENTION

An embodiment of the present invention will now be described with reference to the accompanying drawings.

Figure 1:
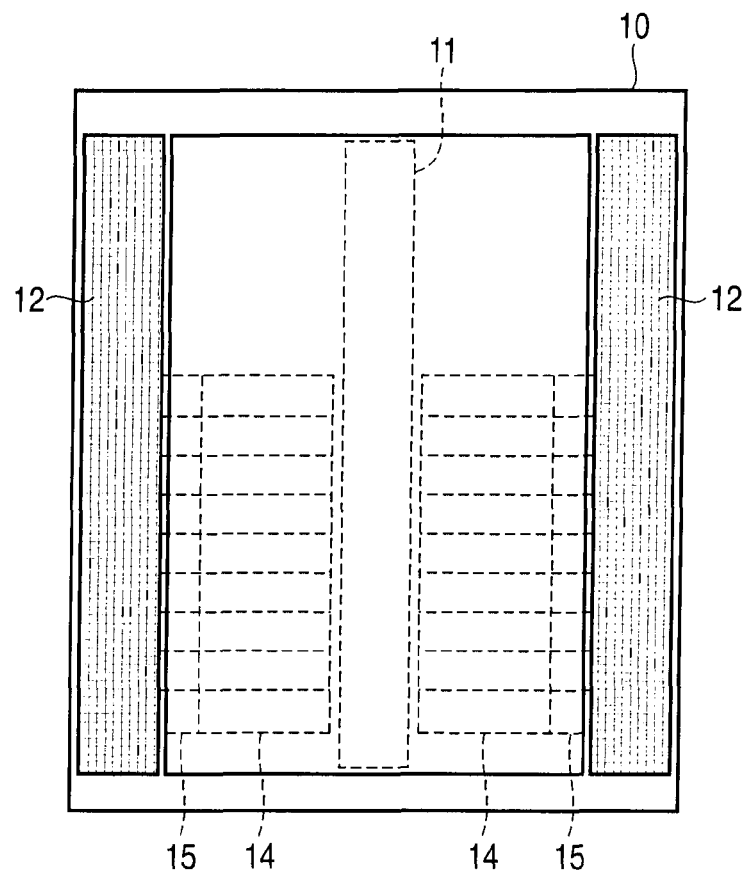
FIG. 1 is a view showing a rear face of an electronic apparatus according to an embodiment of the present invention.
Figure 2:
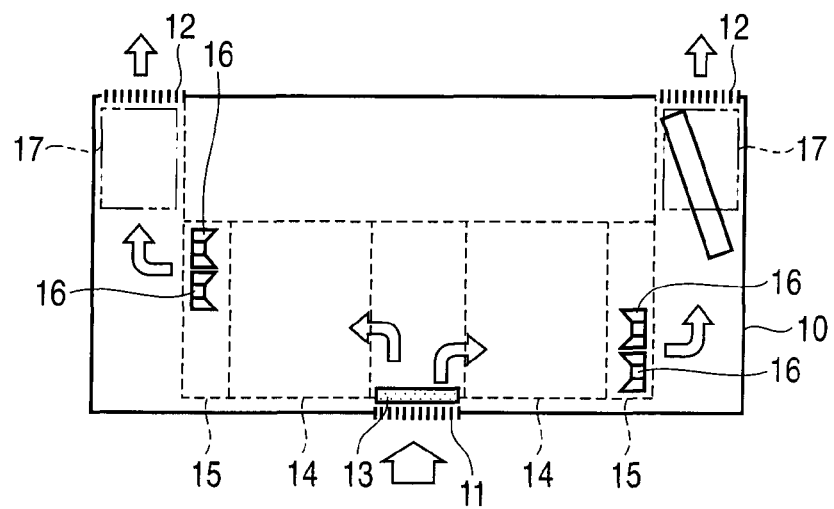
FIG. 2 is a view showing a cooling mechanism arrangement for an electronic circuit housed in the electronic apparatus shown in FIG. 1.

FIG. 1 shows an electronic apparatus according to an embodiment of the present invention. A case 10 is provided with an air intake 11 which is vertically elongated along a substantially middle portion on a front face of the case 10, for example. On both sides of a rear face of the case 10, exhaust openings 12 are also provided, which are vertically elongated. The air intake 11 is located between the exhaust openings 12. A filter member 13 is provided on the air intake 11 as shown in FIG. 2. The air for cooling an exterior is taken into the case 10 through the filter member 13.

Electronic circuits including power amplifiers 14 are stacked in two columns in the case 10. The air intake 11 is located between the columns. One column of the power amplifiers 14 is communicated with one of the exhaust openings 12 via a duct 15, which provides an exhaust channel. The other column of the power amplifiers 14 is also communicated with the other of the exhaust openings 12 via another duct 15, which provides another exhaust channel.

It should be noted that another configuration of the air intake 11 and the exhaust openings 12 is possible in the case 10.

In the ducts 15, exhaust fans 16 are provided in association with the power amplifiers 14. In one exhaust channel, evaporation units 17 are positioned between an exhaust opening 12 and an exhausting side of an exhaust fan 16. Also in another channel, evaporation units 17 are positioned between an exhaust opening 12 and an exhausting side of an exhaust fan 16. The evaporation units 17 in one channel are opposed to the evaporation units 17 in another channel. Each of the evaporation units 17 is individually configured. An internal air is discharged from the ducts 15 through the exhaust fans 16 and blown on the evaporation units 17. The evaporation units 17 cause thermal exchange between the internal air and a circulating working medium to cool the internal air. The evaporation units 17 guide the internal air to be discharged from the exhaust openings 12.

Figure 3:
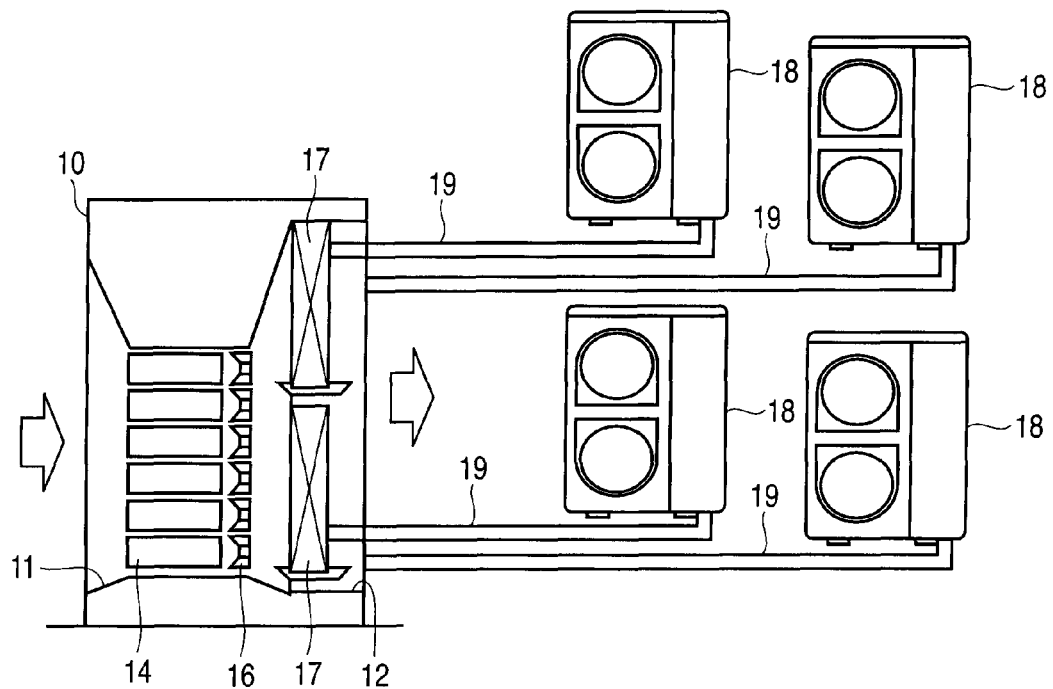
FIG. 3 is a view showing an arrangement of power amplifiers, exhausting fans, evaporation units, and outdoor units according to the embodiment.
Figure 4:
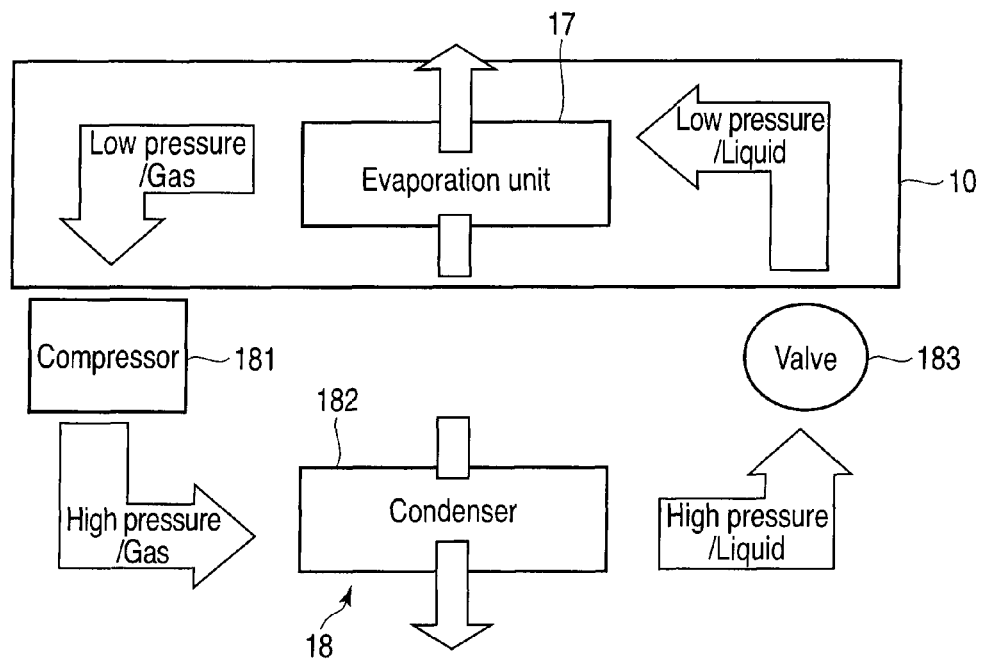
FIG. 4 is a view showing a cooling cycle provided by an evaporation unit and an outdoor unit according to the embodiment.

For example, as shown in FIG. 3, outdoor units 18 which include condensing units are connected to the evaporation units 17 via pipelines 19. The outdoor units 18 are driven by inverter control. According to the inverter control, an effective voltage and a frequency of an alternating-current power output can be arbitrarily controlled. When the inverter control is conducted at a low frequency, power consumption of the outdoor units 18 can be suppressed. Each of the outdoor units 18 includes a compressor 181, a condenser 182, and a pressure reducing valve 183, as shown in FIG. 4. The working medium is vaporized in the evaporation unit 17 and supplied to the compressor 181 via the pipeline 19. The compressor 181 compresses the working medium to raise the pressure, and the condenser 182 liquidizes the working medium. The pressure reducing valve 183 reduces the pressure in the working medium, and then, the working medium is circularly supplied to the evaporation unit 17.

Thus, the evaporation unit 17 causes the thermal exchange between the internal air, which is blown from the exhaust fans 16, and the working medium, the pressure of which is reduced by the pressure reducing valve 183, to cool the internal air. The wind power of the exhaust fans 16 ejects the cooled internal air through the evaporation units 17 and the exhaust openings 12. In the present embodiment, the inverter control is employed in order that cooling the air is driven at a high frequency to assure a high cooling performance and at a low frequency to provide a lower cooling performance. Cooling operation at a low frequency allows the power consumption to be reduced. The cooling operation may be performed at a high frequency as well to provide a higher cooling performance, if necessary.

Figure 5:
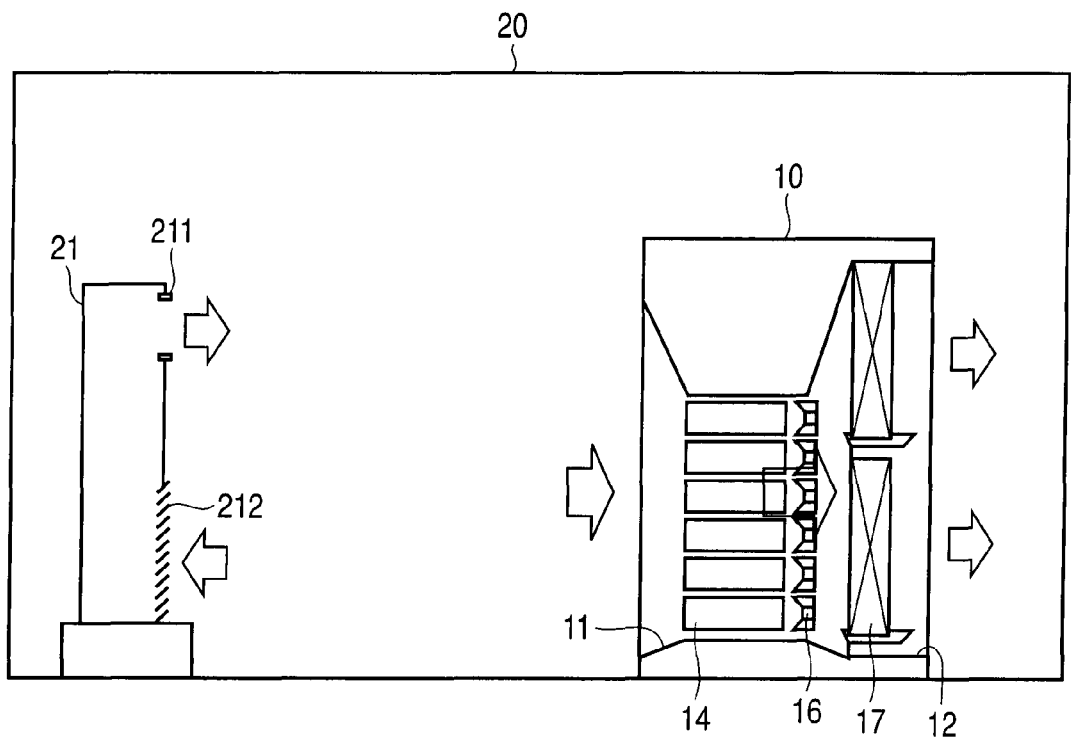
FIG. 5 is a view showing a setting of a case of the electronic apparatus, according to an embodiment.

In the above configuration, the case 10 is provided in a room 20 such as a base station. As shown in FIG. 5, the front face of the case 10 is opposed to a stationary air conditioner 21. The power amplifiers 14 are used for a desired operation. The air conditioner 21 ejects air having a temperature (28° C., for example) which is lower than the temperature of the room 20 from an ejection opening 211. The ejected air is mixed with the air in the room 20, and the temperature of the room 20 is adjusted. The exhaust fans 16 are driven to take the air conditioned by the air conditioner 21 into the air intake 11 of the case 10. The air is guided to the power amplifiers 14 and absorbs heat which is generated by driving of the power amplifiers 14. Thus, the air rises in temperature up to 45° C., for example. Accordingly, the power amplifiers 14 are cooled down.

The temperature of the air which has absorbed the heat from the power amplifiers 14 comes to rise up. The air is blown on the evaporation units 17 by the wind power of the exhaust fans 16. The evaporation units 17 cool the air down (to 33° C., for example) by the thermal exchange with the working medium which is circularly supplied form the outdoor units 18. The air is ejected from the exhaust openings 12 to the room 20.

A suction opening 212 of the air conditioner 21 sucks the cooled air (33° C., for example) which is expelled from the exhaust openings 12. The air conditioner 21 further cools the air down toward 28° C. The air is ejected from the ejection opening 211 to the room 20, to condition the temperature of the room 20. Thus, when the electronic apparatus is provided with the evaporation units 17 and the outdoor units 18 having a small air conditioning performance, and when the air conditioner 21 is provided with cooling availability which cools the air by 5 degrees, the high-efficiency thermal control is possible and a cooling mechanism which assumes low power can be achieved. The cooling mechanism may be preferable to the electronic apparatus system. The temperature of the air taken in the case 10 is maintained at about 30° C. due to air conditioning by the air conditioner 21. Therefore, in comparison with the case where the air is not conditioned, the thermal control for the power amplifiers 14 can be performed with the low cooling performance by the evaporation units 17 and the outdoor units 18.

The air taken in the case 10 is warmed up by the power amplifiers 14, passes through the evaporation units 17 to be subjected to the thermal exchange, and is cooled. The humidity of the air is also reduced and the air is ejected from the exhaust openings 12 to the room 20. The air conditioner 21 takes in the low humidity air from the room 20 and performs latent heat cooling and sensible heat cooling to condition the air in the room 20. If the humidity of the air taken in the air conditioner 21 is low, the heat processing is performed under a condition where necessity of the latent heat cooling is decreased and the air conditioner 21 mainly performs sensible heat cooling. Therefore, the cooling performance is improved. Thus, the latent heat cooling need not to be performed and requirement for the cooling performance is relieved. Therefore, the lower cooling performance can sufficiently condition the air in the room 20.

That is, the electronic apparatus is configured as follows. The air intake 11 in the case 10 takes in air from the room 20 that is conditioned by the air conditioner 21 by the exhausting fans 16. The air absorbs heat generated by driving of the power amplifiers 14. The air is cooled by the thermal exchange with the working medium of the evaporation units 17. The cooled air is forced to be ejected from the exhaust openings 12 by the wind force of the exhaust fans 16.

The conditioned air is taken in the air intake 11 and warmed up by the heat emitted from the power amplifiers 14. The wind power of the exhaust fans 16 guides the air to the evaporation units 17. The air is cooled by the evaporation units 17 and ejected out of the case 10. Thus, minimum temperature control for the internal air of the room 20 which is to be taken in the air intake 11 realizes the high-efficient thermal control for the power amplifiers 14 housed in the case 10. As a result, the air-conditioning performance required to condition the air in the room 20 where the case 10 is set need not be so high. Power-saving in the electronic apparatus system can be improved.

For example, in the case of maintaining the electronic apparatus system including repairing the compressor 181 and condenser 182 in any of the outdoor units 18, a cooling system required to be checked is stopped, while keeping the thermal control for the power amplifiers 14 to be in operation utilizing other cooling systems (or other combinations of the evaporation units 17 and the outdoor units 18). Thus, the electronic apparatus system can operate continuously. Therefore, the outdoor units 18, which require frequent maintenance, can be readily maintained while continuing the operation of the electronic apparatus system.

In addition, when the air conditioner 21 breaks down, for example, only the evaporation units 17 and outdoor units 18 may be used to provide a higher cooling performance by the inverter control. Thus, thermal control for the power amplifiers 14 is continuously conducted, and also the electronic apparatus system can operate continuously.

According to the embodiment, the evaporation units 17 share the exhausting fans 16 having a long durable period, as a wind power source, which work as the forced cooling means to force heat emission. The exhausting fans 16 compulsory blows wind on the power amplifiers 14 which are continuously driven. Thus, the thermal exchange system is configured.

Accordingly, while keeping the case 10 to be in a small size, a durable period of the thermal exchange system utilizing the evaporation units 17 can be prolonged so that the thermal exchange system can be continuously used for substantially the same durable period as the exhausting fans 16. For example, the exhausting fans 16 are produced, in general, to be operational for a long period which is corresponding to the durable period of the power amplifiers 14. When the thermal exchange system is established using the evaporation units 17, which share the exhausting fans 16 that is improved in durability, the thermal exchange system which is durable for a period corresponding to the power amplifiers 14 can be provided readily.

In the above embodiment, the exhausting fans 16 of the forced cooling means are provided on the side where the exhausting openings 12 are attached in the case 10. However, the invention is not so limited. The exhausting fans 16 may be arranged on the side where the air intake 11 is provided, and similar effect to the above embodiment will be achieved.

In the above embodiment, the evaporating units 17 are provided in association with the exhausting fans 16. However, the invention is not so limited. For example, a plurality of evaporating units 17 may be arranged in association with an exhausting fan 16, and similar effect to the above embodiment will be achieved.

In the above embodiment, the evaporating units 17 are housed in the case 10. However, the invention is not so limited. The evaporation units 17 may be arranged outside of the exhausting openings 12.

Figure 6:
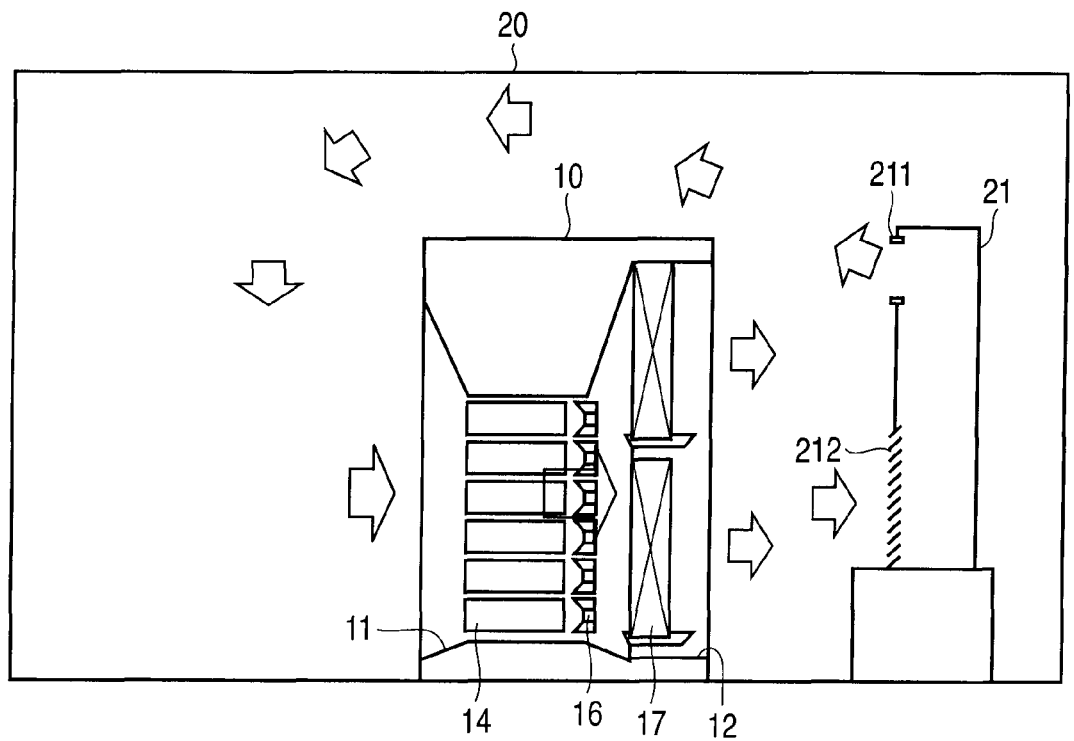
FIG. 6 is a view showing another setting of the case of the electronic apparatus, according to an embodiment.

In the above embodiment, the air intake 11 in the case 10 is opposed to the ejection opening 211 and the suction opening 212 of the air conditioner 21 which is placed in the room 20. However, the arrangement is not so limited. For example, as shown in FIG. 6, the exhausting openings 12 in the case 10 may be opposed to the ejection opening 211 and the suction opening 212 of the air conditioner 21. In addition, the air conditioner 21 is not limited to the stationary type. Another configuration of air conditioning devices may be employed to present similar effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
a case configured to house an electronic circuit unit and comprising an air intake, through which external air is taken into the case, and an exhausting opening, from which the air is ejected;
a circulator provided in the case and configured to take the external air into the case through the air intake and blow the air to the electronic circuit unit;
a plurality of evaporation units provided in the case and configured to cool the air conducted to the plurality of evaporation units via a closed duct by thermal exchange between the air and a working medium and guide the air to the exhausting opening, the working medium being vaporized as a result of the thermal exchange; and
a plurality of condensers provided out of the case and configured to liquidize the working medium and supply the working medium to the evaporation units,
wherein operation frequencies of the evaporation units and the condensers undergo inverter control based on required cooling capacities thereof.

2. The electronic apparatus according to claim 1,
wherein the plurality of evaporation units are respectively connected to the plurality of condensers.

3. The electronic apparatus according to claim 2,
the electronic circuit unit including a plurality of electronic circuits,
wherein the circulator supplies the air to the electronic circuits individually.

4. The electronic apparatus according to claim 3,
wherein at least one of the evaporation units is opposed to one side of at least one of the electronic circuits, from the one side, heat generated by the at least one of the electronic circuits being ejected.

5. The electronic apparatus according to claim 3,
wherein the circulator includes exhausting fans in association with the electronic circuits, and at least one of the plurality of evaporation units is provided in association with the exhausting fans.

6. The electronic apparatus according to claim 1,
wherein the electronic circuit unit includes a power amplifier for a transmitter.

7. The electronic apparatus according to claim 1,
wherein the case is placed in a room which is air-conditioned.

8. A cooling system for an electronic apparatus comprising an electronic circuit unit, the cooling system comprising:
a circulator configured to take external air into a case of the electronic apparatus and supply the air to the electronic circuit unit;
an evaporation unit configured to cool the air conducted to the evaporation unit via a closed duct by thermal exchange between the air and a working medium and guide the air to be ejected from the case of the electronic apparatus, the working medium being vaporized as a result of the thermal exchange; and
a condenser provided out of the case and configured to liquidize the working medium and supply the working medium to the evaporation unit,
wherein operation frequencies of the evaporation unit and the condenser undergo inverter control based on required cooling capacities thereof.

* * * * *